United States Patent
Lin

(10) Patent No.: US 10,157,991 B2
(45) Date of Patent: Dec. 18, 2018

(54) METHOD FOR FABRICATING NON-VOLATILE MEMORY DEVICE WITH HIGH PRECISION OF FLOATING GATE FORMING

(71) Applicant: TAIWAN SEMICONDUCTOR MANUFACTURING CO., LTD., Hsinchu (TW)

(72) Inventor: Hsing-Chih Lin, Tainan (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 0 days.

(21) Appl. No.: 15/875,304

(22) Filed: Jan. 19, 2018

(65) Prior Publication Data

US 2018/0145142 A1 May 24, 2018

Related U.S. Application Data

(62) Division of application No. 14/105,341, filed on Dec. 13, 2013, now Pat. No. 9,876,086.

(51) Int. Cl.
| | |
|---|---|
| *H01L 29/423* | (2006.01) |
| *H01L 29/66* | (2006.01) |
| *H01L 29/788* | (2006.01) |
| *H01L 27/11521* | (2017.01) |

(52) U.S. Cl.
CPC .. *H01L 29/42324* (2013.01); *H01L 27/11521* (2013.01); *H01L 29/66825* (2013.01); *H01L 29/7881* (2013.01); *H05K 999/99* (2013.01)

(58) Field of Classification Search
CPC ......... H01L 29/42324; H01L 27/11517; H01L 27/11521; H01L 29/66825; H01L 29/7881; H05K 999/99
See application file for complete search history.

(56) References Cited

U.S. PATENT DOCUMENTS

| | | |
|---|---|---|
| 6,635,533 B1 | 10/2003 | Chang et al. |
| 6,710,396 B1 | 3/2004 | Wu |
| 7,297,598 B2 | 11/2007 | Liu et al. |
| 7,492,002 B2 | 2/2009 | Jeon et al. |
| 7,602,008 B2 | 10/2009 | Kang et al. |
| 7,791,951 B2 * | 9/2010 | Jeon .................. G11C 16/0425 257/316 |
| 7,928,491 B2 | 4/2011 | Nakata et al. |

(Continued)

*Primary Examiner* — Peter Bradford
(74) *Attorney, Agent, or Firm* — Birch, Stewart, Kolasch & Birch, LLP

(57) ABSTRACT

A method for fabricating a memory device is provided. The method for fabricating a memory device includes forming a first dielectric layer over a substrate and forming a floating gate layer over the first dielectric layer. The method further includes forming a hard mask layer over the floating gate layer and etching the hard mask layer to form a recess in the hard mask layer. The method further includes patterning a portion of the hard mask layer under the recess to form a recessed feature having a first tip corner and etching the recessed feature and the floating gate layer to form a floating gate having a second tip corner. The method further includes depositing a second dielectric layer over the floating gate and forming a control gate partially over the floating gate and separating from the floating gate by the second dielectric layer.

20 Claims, 5 Drawing Sheets

(56) References Cited

U.S. PATENT DOCUMENTS

| | | |
|---|---|---|
| 2005/0112821 A1 | 5/2005 | Kim et al. |
| 2006/0062069 A1 | 3/2006 | Jeon et al. |
| 2006/0170029 A1 | 8/2006 | Liu et al. |
| 2006/0202255 A1 | 9/2006 | Jeon et al. |
| 2007/0205436 A1 | 9/2007 | Huang et al. |
| 2008/0135915 A1 | 6/2008 | Liaw et al. |
| 2008/0242026 A1 | 10/2008 | Matsuzaki et al. |
| 2012/0028424 A1* | 2/2012 | Shimizu ............... H01L 27/115 438/257 |
| 2015/0200292 A1* | 7/2015 | Chang ............... H01L 21/28273 257/316 |

* cited by examiner

METHOD FOR FABRICATING NON-VOLATILE MEMORY DEVICE WITH HIGH PRECISION OF FLOATING GATE FORMING

CROSS REFERENCE TO RELATED APPLICATIONS

This application is a Divisional application of U.S. patent application Ser. No. 14/105,341, filed on Dec. 13, 2013, the entire of which is incorporated by reference herein.

BACKGROUND

Memory devices are used in a variety of electronic applications, such as personal computers, cell phones, digital cameras, and other electronic equipment. Memory devices are typically fabricated by sequentially depositing insulating or dielectric layers, conductive layers, and semi-conductive layers of material over a semiconductor substrate, and patterning the various material layers using lithography to form circuit components and elements thereon.

A non-volatile memory device is a memory device that will retain stored data even while power is off The non-volatile memory device is utilized in various products and devices where power is not always available, frequently interrupted and/or low power usage is required. One type of non-volatile memory devices is a split-gate non-volatile memory device. In the split-gate non-volatile memory device, an over erase problem associated with stacked gate structures is eliminated by the use of a split gate structure.

BRIEF DESCRIPTION OF THE DRAWINGS

For a more complete understanding of the present disclosure, and the advantages thereof, reference is now made to the following descriptions taken in conjunction with the accompanying drawings.

DETAILED DESCRIPTION OF THE ILLUSTRATIVE EMBODIMENTS

The making and using of various embodiments of the disclosure are discussed in detail below. It should be appreciated, however, that the various embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are formed in direct or indirect contact.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

A non-volatile memory device has a split gate cell including a floating gate over a tunnel dielectric layer. The floating gate may have tip corners for enhancing the erasing performance of the floating gate. The tip corners may be formed by forming a local oxidation of silicon (LOCOS) structure on an upper surface of a polysilicon layer and then patterning the polysilicon layer using the LOCOS structure as a mask. The LOCOS structure is usually formed by thermal oxidation, resulting in an increased thermal budget. In addition, bird's beaks and aggressive growth sometimes occur in the LOCOS structure, which may narrow the process window and influence the erasing performance of the floating gate.

Accordingly, embodiments of mechanisms for forming a non-volatile memory device that has a split gate stack structure and the absence of a LOCOS structure are also provided. In these embodiments, tip corners of floating gates are formed by pattern duplication.

Figure 1:
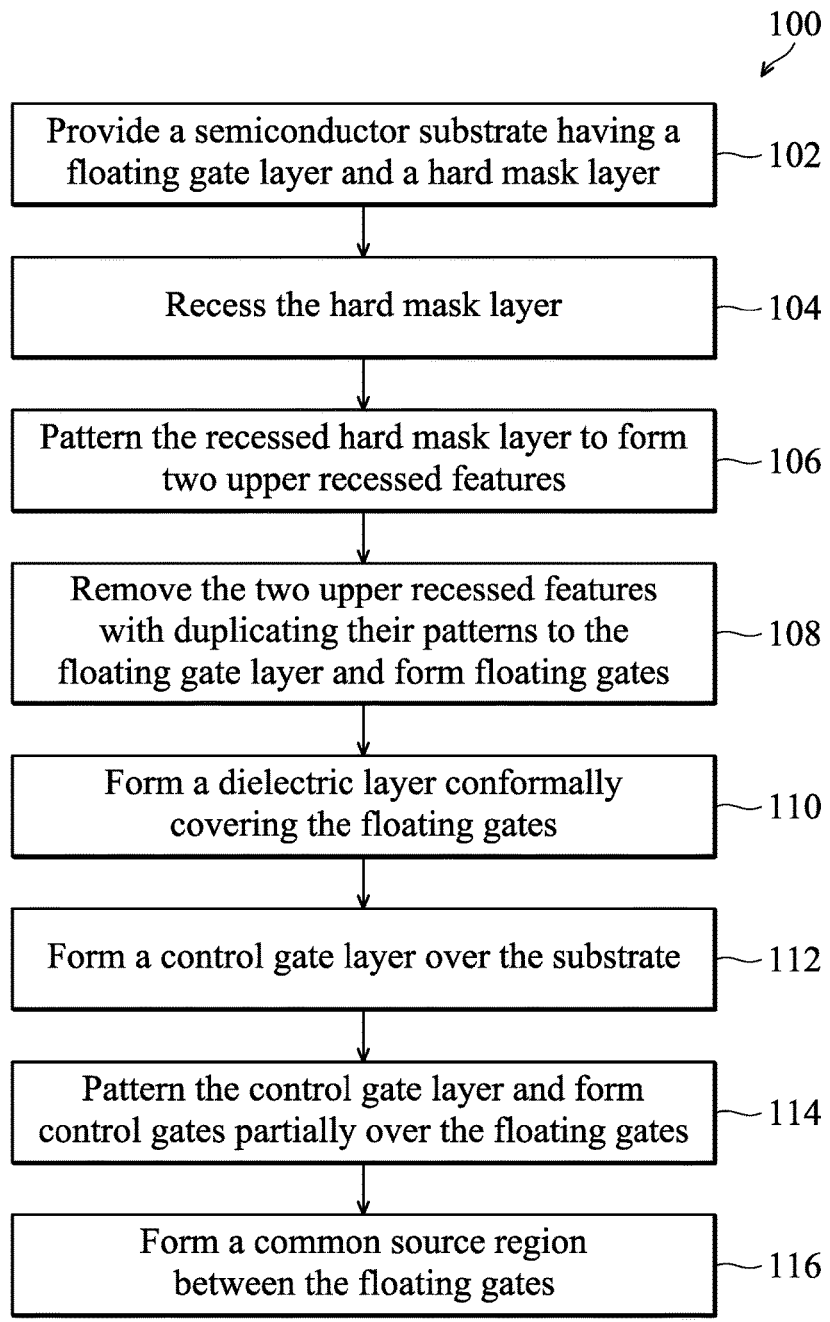
FIG. 1 shows a flow chart of a method for fabricating a memory device, in accordance with some embodiments of the disclosure.

Referring to FIG. 1, illustrated is a flowchart of a method 100 for forming a memory device 200. With additional reference to FIGS. 2 to 9 as cross-sectional views of the memory device 200 during fabrication, the memory device 200 and the method 100 to make the same are described below. The method 100 is simplified for better understanding of the concepts of the disclosure, and additional processes may be provided before, during, and after the method 100 of FIG. 1 and are not shown in FIGS. 2 to 9.

Figure 2:
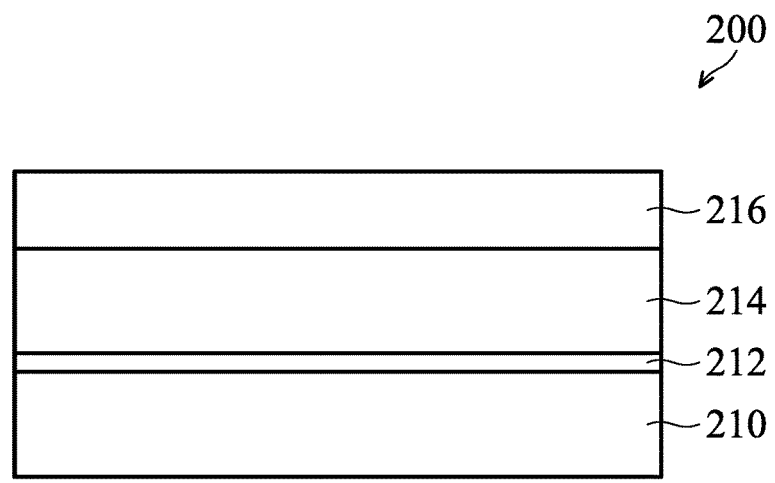
FIG. 2 shows a cross-sectional representation of various stages during the fabrication of a memory device, in accordance with some embodiments of the disclosure.

Referring to FIGS. 1 and 2, the method 100 begins in operation 102 by providing a semiconductor substrate (substrate) 210, in accordance with some embodiments. The substrate 210 may include an elementary semiconductor such as silicon, germanium, and/or diamond. The substrate 210 may also include a compound semiconductor such as silicon carbide, gallium arsenic, indium arsenide, and/or indium phosphide. The substrate 210 may include an alloy semiconductor such as silicon germanium, silicon germanium carbide, gallium arsenic phosphide, and/or gallium indium phosphide. In some embodiments, the substrate 210 includes an epitaxial layer. For example, the substrate 210 has an epitaxial layer overlying a bulk semiconductor. In some embodiments, the substrate 210 is strained for performance enhancement. For example, the epitaxial layer includes semiconductor materials different from those of the bulk semiconductor such as a layer of silicon overlying a bulk silicon germanium formed by a process including selective epitaxial growth (SEG). Furthermore, the substrate 210 may include a semiconductor-on-insulator (SOI) structure. For example, the substrate 210 includes a buried oxide (BOX) layer formed by a process such as separation by implanted oxygen (SIMOX).

In some embodiments, the substrate 210 includes an isolation feature to separate different devices formed on the substrate 210. The isolation feature may include different structures and can be formed using different processing technologies. For example, the isolation feature includes dielectric isolation including LOCOS and shallow trench isolation (STI), junction isolation, field isolation, and/or suitable isolation structure. In some embodiments, the substrate 210 includes various doping features, such as a well, a source, a drain and/or other doping features. The various doping regions may be accomplished by ion-implantation and/or diffusion.

In some embodiments, the memory device 200 includes a peripheral region and a memory cell region, although only a portion of the memory cell region is shown in FIGS. 2 to 9. The memory cell region may include a plurality of non-volatile memory (NVM) cells. The NVM cells may have a split-gate structure, a stacked-gate structure, another proper structure, and/or combinations thereof. The peripheral region may include a variety of other microelectronic devices formed in the same substrate including passive components such a resistor, an inductor, and a capacitor and active components such as NPN bipolar transistors, diodes, NMOS, PMOS, complementary MOS (CMOS), or other devices.

The memory device 200 further includes a dielectric layer 212 (or first dielectric layer) over the substrate 210. In some embodiments, the dielectric layer 212 is made of silicon oxide, silicon oxynitride, a high-k dielectric or a combination thereof. Example high-k dielectrics includes hafnium oxide ($HfO_2$), hafnium silicon oxide (HfSiO), hafnium silicon oxynitride (HfSiON), hafnium tantalum oxide (HfTaO), hafnium titanium oxide (HfTiO) and hafnium zirconium oxide (HfZrO). Alternatively, the dielectric layer 212 may include other high-k dielectrics such as LaO, AlO, ZrO, TiO, $Ta_2O_5$, $Y_2O_3$, $SrTiO_3$ (STO), $BaTiO_3$(BTO), BaZrO, HfLaO, HfSiO, LaSiO, AlSiO, $(Ba,Sr)TiO_3$ (BST), $Al_2O_3$, $Si_3N_4$, and/or other suitable materials. The dielectric layer 212 may formed by atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, or other applicable processes.

The memory device 200 further includes a floating gate layer 214 over the dielectric layer 212. In some embodiments, the floating gate layer 214 is made of polysilicon. Alternatively, the floating gate layer 214 may be made of metal, metal silicide, metal nitride, or a dielectric having a high trapping density, such as silicon nitride. The floating gate layer 214 may be formed by CVD, PVD, silicidation, nitridation, plating and/or ALD. In some embodiments, the floating gate layer 214 involves more processes during formation such as ion implant doping.

The memory device 200 further includes a hard mask layer 216 over the floating gate layer 214. In some embodiments, the hard mask layer 216 includes silicon oxide, silicon nitride, silicon oxynitride, silicon carbide, and/or other suitable dielectric materials and is formed by a method such as CVD or PVD.

Figure 3:
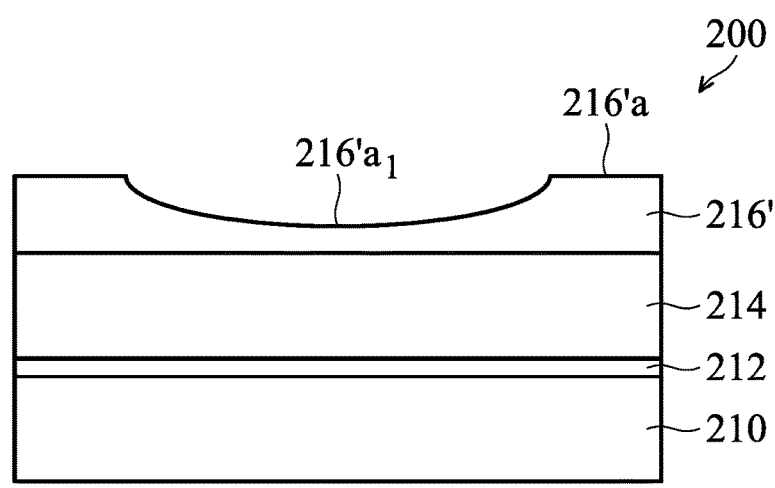
FIG. 3 shows a cross-sectional representation of various stages during the fabrication of a memory device, in accordance with some embodiments of the disclosure.

Referring to FIGS. 1 to 3, the method 100 proceeds to operation 104 in which the hard mask layer 216 is recessed, in accordance with some embodiments. As shown in FIG. 3, an upper portion of the hard mask layer 216' is recessed, and therefore the hard mask layer 216' has an upper surface 216'a that includes a concave surface 216'$a_1$. In some embodiments, the concave surface 216'$a_1$ is a semicircular surface. Alternatively, the concave surface 216'$a_1$ may be a semielliptical surface. The hard mask layer 216' may be recessed by an isotropic etch process, such as using a solution of $H_3PO_4$, HF, buffer oxide etch (BOE) or a combination thereof.

In some embodiments, a patterned photoresist layer (not shown) is applied over the hard mask layer 216 before the starting of the recession. The patterned photoresist layer covers an outer portion of the hard mask layer 216 and defines the size of the concave surface 216'$a_1$. In some embodiments, the patterned photoresist layer is removed after the hard mask layer 216' is recessed.

Figure 4:
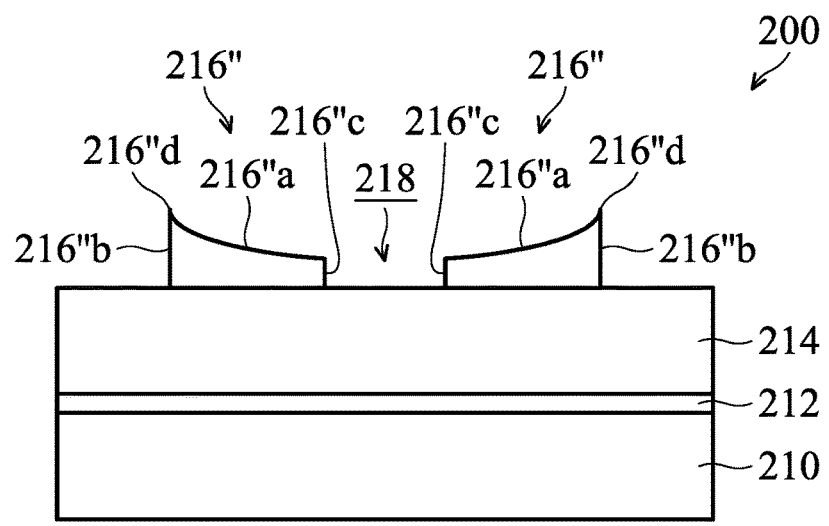
FIG. 4 shows a cross-sectional representation of various stages during the fabrication of a memory device, in accordance with some embodiments of the disclosure.

Referring to FIGS. 1 to 4, the method 100 proceeds to operation 106 in which the recessed hard mask layer 216' is further patterned to form two upper recessed features 216", in accordance with some embodiments. As shown in FIG. 4, a portion of the hard mask layer 216' is removed and forms an opening 218 that exposes the floating gate layer 214 and separates the two upper recessed features 216" from each other. Each of the upper recessed features 216" may have a concave surface 216"a, such as in a quarter-round like shape or in a quarter-elliptic like shape. In some embodiments, each of the upper recessed features 216" has a height that is continuously decreased from its outer sidewall 216"b to its inner sidewall 216"c (i.e., the height of concave surface 216"a continuously decreased from the outer sidewall 216"b to the inner sidewall 216"c). In some embodiments, the two upper recessed features 216" are mirror images of one another.

In some embodiments, an outer portion of the hard mask layer 216' is also removed. As such, each of the upper recessed features 216" has a tip corner 216"d at or near its outer sidewall 216"b. The tip corners 216"d of the upper recessed features 216" are oriented away from the substrate 210, and each of them is oriented away from each other. The outer sidewalls 216"b of the upper recessed features 216" may be aligned with or inwardly shift from the outer boundary of concave surface 216'$a_1$ as shown in FIG. 3, in accordance with design requirements. In some embodiments, the critical dimension of floating gates in the final structure of the memory device 200 is determined by the upper recessed features 216".

In some embodiments, the patterning of the upper recessed features 216" is achieved with a suitable process such as photolithography processing and etching. The photolithography processing may include photoresist coating, soft baking, mask aligning, exposing pattern, post-exposure baking, developing photoresist, hard baking and stripping after the etching. The photolithography patterning may also be achieved by other suitable methods such as maskless photolithography, electron-beam writing, ion-beam writing, optical writing or molecular imprint. The etching may include a dry etching process such as reactive ion etch (RIE) or other suitable processes.

Figure 5:
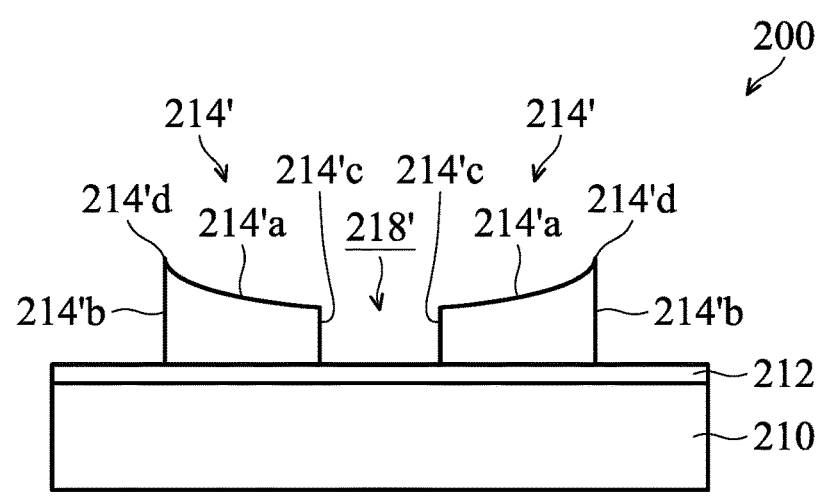
FIG. 5 shows a cross-sectional representation of various stages during the fabrication of a memory device, in accordance with some embodiments of the disclosure.

Referring to FIGS. 1 to 5, the method 100 proceeds to operation 108 in which the two upper recessed features 216" are removed while duplicating their patterns on the floating gate layer 214, in accordance with some embodiments. The patterns of the upper recessed features 216" are duplicated on the underlying floating gate layer 216 and form split floating gates 214' during the removal of the upper recessed features 216". The pattern duplication includes duplicating the lateral dimensions and upper surface profiles of the upper recessed features 216" on the floating gate layer 214. As such, each of the floating gates 214' has the same or similar lateral dimensions and upper surface profiles as the upper recessed features 216". As shown in FIG. 5, the floating gates 214' are separated by an opening 218'. Each of the floating gates 214' has a tip corner 214'$d$ at or near its outer sidewall 214'$b$. The tip corners 214'$d$ of the floating gates 214' are oriented away from the substrate 210, and each of them is oriented away from each other. Each of the floating gates 214' has a concave surface 214'$a$, such as in a quarter-round like shape or in a quarter-elliptic like shape. Each of the floating gates 214' has a height that is continuously decreased from its outer sidewall 214'$b$ to its inner sidewall 214'$c$ (i.e., the height of concave surface 214'$a$ continuously decreased from the outer sidewall 214'$b$ to the inner sidewall 214'$c$) and therefore has only one tip corner 214'$d$. In some embodiments, the floating gates 214' are mirror images of one another.

In some embodiments, the removal of the upper recessed features 216" while duplicating the patterns is achieved by using an etching process. The etching process may include performing both an isotropic etch and an anisotropic etch. For example, in the etching process, about 50% to about 80% of the upper recessed features 216" are removed by the isotropic etching, and the remaining upper recessed features 216" are then removed by the anisotropic etching. In some embodiments, the upper surface profile of the upper recessed features 216" is duplicated while performing the anisotropic etch. In some embodiments, an etching rate ratio of the upper recessed features 216" and the floating gate layer 214 under the isotropic etch is in a range from about 0.5 to about 1.5. In addition, an etching rate ratio of the upper recessed features 216" and the floating gate layer 214 under the anisotropic etch is in a range from about 5 to about 10. In some embodiments, the isotropic etch uses a solution of $H_3PO_4$, HF, buffer oxide etch (BOE) or a combination thereof. The anisotropic etch uses an etchant selected from $CF_x$, $CH_yF_z$ (wherein x, y and z denote positive integers), HBr, and $Cl_2$.

Figure 6:
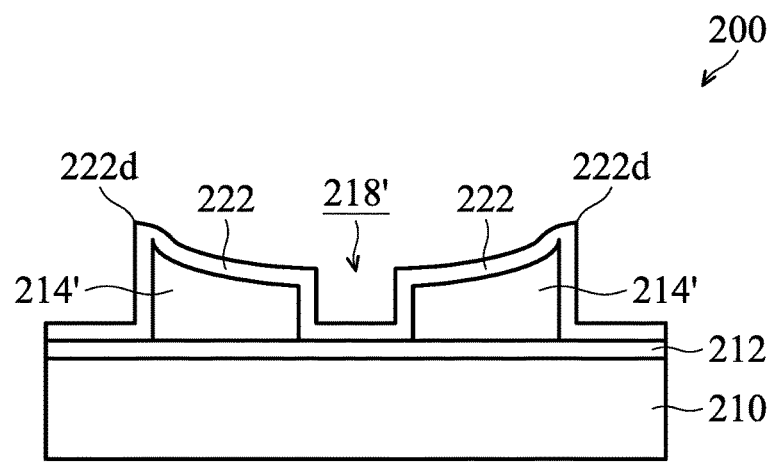
FIG. 6 shows a cross-sectional representation of various stages during the fabrication of a memory device, in accordance with some embodiments of the disclosure.

Referring to FIGS. 1 to 6, the method 100 proceeds to operation 110 in which another dielectric layer 222 (or second dielectric layer) is deposited over the substrate 210 and conformally covers the floating gates 214', in accordance with some embodiments. As shown in FIG. 6, the dielectric layer 222 conformally covers the floating gates 214' and extends through the opening 218'. The dielectric layer 222 may have a substantially uniform thickness. For example, the dielectric layer 222 has a thickness ranging from about 20 Å to about 800 Å. The dielectric layer 222 may cover the upper surfaces 214'$a$ and sidewalls 214'$b$ and 214'$c$ of the floating gates 214'. In some embodiments, due to the conformal covering, the dielectric layer 222 also has corner tips 222$d$ which are formed near the corner tips 214'$d$.

The dielectric layer 222 is made of silicon oxide, silicon oxynitride, a high-k dielectric or a combination thereof. Example high-k dielectrics include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), a combination thereof, and/or other suitable materials. Alternatively, the dielectric layer 222 may include other high-k dielectrics such as LaO, AlO, ZrO, TiO, $Ta_2O_5$, $Y_2O_3$, $SrTiO_3$ (STO), $BaTiO_3$(BTO), BaZrO, HfLaO, HfSiO, LaSiO, AlSiO, $(Ba,Sr)TiO_3$ (BST), $Al_2O_3$, $Si_3N_4$, and/or other suitable materials. The dielectric layer 222 may be formed by atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, or other applicable processes.

Figure 7:
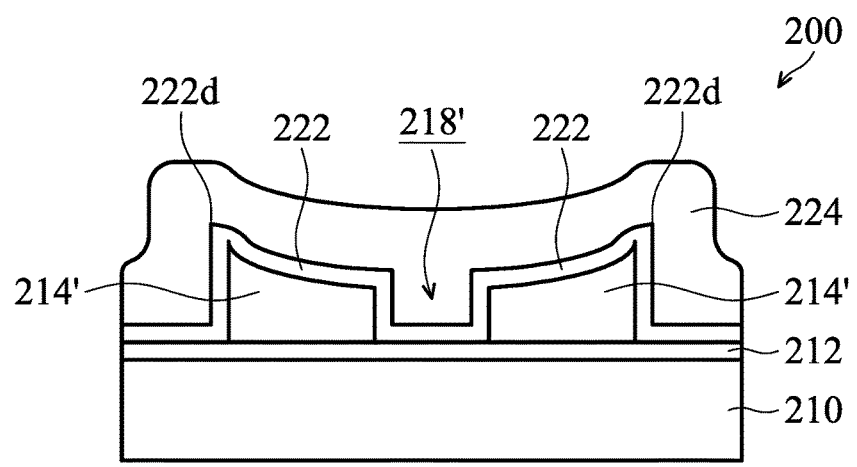
FIG. 7 shows a cross-sectional representation of various stages during the fabrication of a memory device, in accordance with some embodiments of the disclosure.

Referring to FIGS. 1 to 7, the method 100 proceeds to operation 112 in which a control gate layer 224 is deposited over the substrate 210, in accordance with some embodiments. As shown in FIG. 7, the control gate layer 224 is deposited over the dielectric layer 222 and fills the opening 218'. The control gate layer 224 may be made of polysilicon. Alternatively, the control gate layer 224 may be made of metal, metal silicide, metal nitride, or a dielectric having a high trapping density, such as silicon nitride. The control gate layer 224 may be formed by CVD, PVD, silicidation, nitridation, plating and/or ALD. In some embodiments, the control gate layer 224 involves more processes during formation such as ion implant doping. In some embodiments, a passivation layer (not shown) is further formed on the control gate layer 224. The passivation layer may include silicon oxide, silicon nitride or silicon oxynitride.

Figure 8:
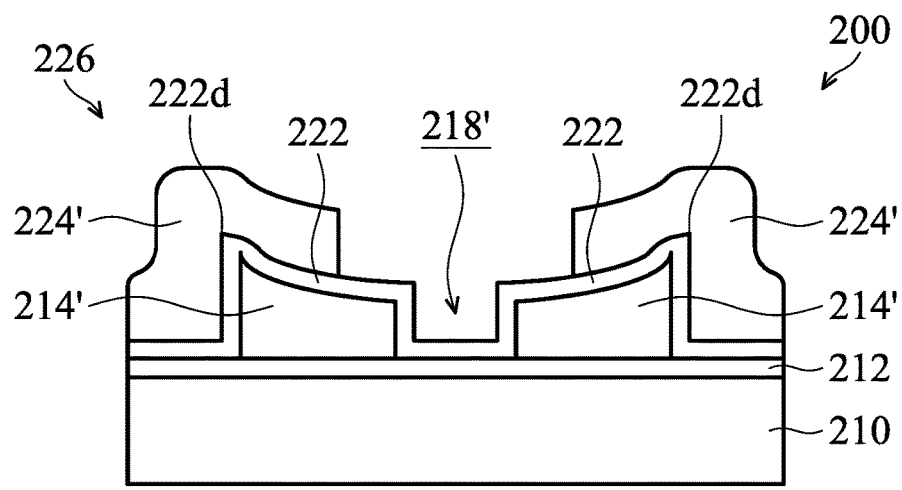
FIG. 8 shows a cross-sectional representation of various stages during the fabrication of a memory device, in accordance with some embodiments of the disclosure.
Figure 9:
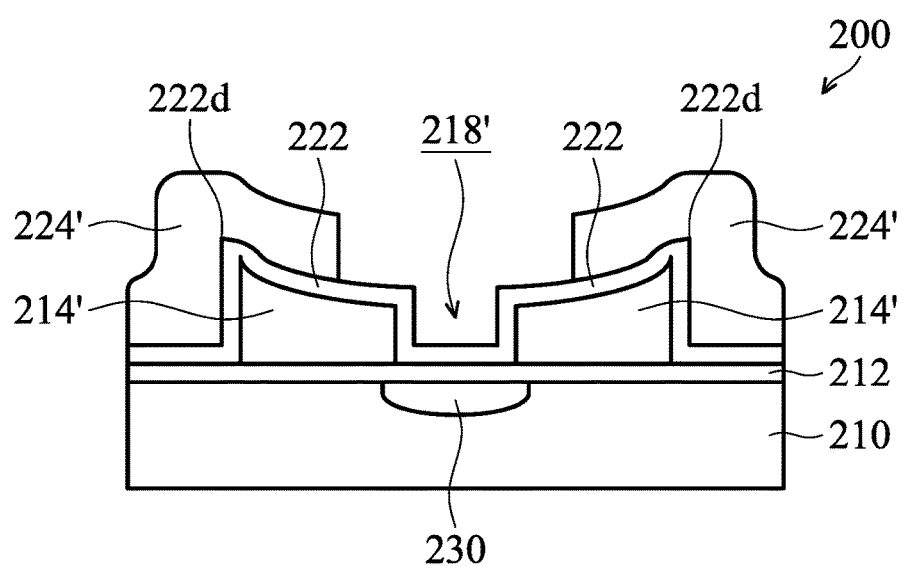
FIG. 9 shows a cross-sectional representation of various stages during the fabrication of a memory device, in accordance with some embodiments of the disclosure.

Referring to FIGS. 1 to 8, the method 100 proceeds to operation 112 in which the control gate layer 224 is patterned to form control gates 224', in accordance with some embodiments. As shown in FIG. 8, each of the control gates 224' is partially overlying one of the floating gates 214', partially overlying the sidewall 214'$b$ of the corresponding floating gate 214' and partially overlying the substrate 210. The corner tips 214'$d$ of the floating gates are towards to the control gates 224'. Gate stack structures 226 are also formed. For example, each of the gate stack structures 226 includes the dielectric layer 212, the floating gate 214', the dielectric layer 222 and the control gate 224'. The floating gates 214' and the control gates 224' of the gate stack structures 226 are separated by the opening 218'.

The patterning of the control gates 224' may be achieved by photolithography processing and etching. The photolithography processing may include photoresist coating, soft baking, mask aligning, exposing pattern, post-exposure baking, developing photoresist, hard baking and stripping after the etching. The photolithography patterning may also be achieved by other suitable methods such as maskless photolithography, electron-beam writing, ion-beam writing, optical writing or molecular imprinting. The etching may include a wet etching process and a dry etching process.

Referring to FIGS. 1 to 9, the method 100 proceeds to operation 114 in which a common source region 230 is formed, in accordance with some embodiments. The common source region 230 may be formed in the substrate 210 and between the floating gates 224'. The common source region 230 may be commonly used by gate stack structures 226. The common source region 230 may be formed by one or more ion implantation processes. In some embodiments, the common source region 230 includes n+ dopants or p+ dopants.

In some embodiments, the memory device 200 includes split gate stack structures, and the floating gates 214' of the split gate stack structures includes tip corners 214'd for enhancing the erasing performance of the floating gates 214'. The tip corners 214'd of the floating gates 214' are formed by pattern duplication, which are achieved by photolithography processing and etching, rather than forming a LOCOS structure. A low thermal budget is achieved since the thermal oxidation of LOCOS is eliminated. In addition, fewer boundary conditions and a wide process window can be achieved according to the method 100. For example, in the method 100, the upper surface profiles and critical dimensions of the floating gates 214' are directly duplicated from the upper recessed features 216" (e.g., hard mask), rather than forming the LOCOS structure. The surface profile and critical dimension of the hard mask 216" is easier to be precisely controlled than a thermally oxidized structure.

Embodiments of mechanisms for fabricating a non-volatile memory device are provided. The non-volatile memory device includes floating gates. The floating gates are formed by photolithography processing and etching, which lead to a high precision of floating gate formation and a low thermal budget. The non-volatile memory device has improved performance and high reliability.

According to some embodiments, a method for fabricating a memory device is provided. The method for fabricating a memory device includes forming a first dielectric layer over a substrate and forming a floating gate layer over the first dielectric layer. The method for fabricating a memory device further includes forming a hard mask layer over the floating gate layer and etching the hard mask layer to form a recess in the hard mask layer. The method for fabricating a memory device further includes patterning a portion of the hard mask layer under the recess to form a recessed feature having a first tip corner and etching the recessed feature and the floating gate layer to form a floating gate having a second tip corner. The method for fabricating a memory device further includes depositing a second dielectric layer over the floating gate and forming a control gate partially over the floating gate and separating from the floating gate by the second dielectric layer.

According to some embodiments, a method of forming a memory device is provided. The method includes forming a floating gate layer over a substrate and forming a hard mask layer having a recess over the floating gate layer. The method also includes patterning the hard mask layer to form a recessed feature having a first tip corner and transferring a shape of the recessed feature to the floating gate layer thereby forming a floating gate having a second tip corner. The method further includes depositing a dielectric layer covering the second tip corner of the floating gate and forming a first control gate over the dielectric layer to partially cover the floating gate.

According to some embodiments, a method of fabricating a memory device is provided. The method of fabricating a memory device includes forming a first dielectric layer over a semiconductor substrate and forming a floating gate layer over the first dielectric layer. The method of fabricating a memory device also includes forming a hard mask layer over the floating gate layer and etching the hard mask layer to form two recessed features separating from each other by an opening. The method of fabricating a memory device further includes patterning the floating gate layer to form a first floating gate and a second floating gate by transferring profiles of the recessed features to the floating gate layer and depositing a second dielectric layer over the first floating gate and the second floating gate. The method of fabricating a memory device further includes forming a first control gate and a second control gate over the second dielectric layer. In addition, the first control gate and the second control gate partially cover the first floating gate and the second floating gate respectively.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for fabricating a memory device, comprising:
   forming a first dielectric layer over a substrate;
   forming a floating gate layer over the first dielectric layer;
   forming a hard mask layer over the floating gate layer;
   etching the hard mask layer to form a recess in the hard mask layer;
   patterning a portion of the hard mask layer under the recess to form a recessed feature having a first tip corner;
   etching the recessed feature and the floating gate layer to form a floating gate having a second tip corner;
   depositing a second dielectric layer over the floating gate; and
   forming a control gate partially over the floating gate and separating from the floating gate by the second dielectric layer.

2. The method for fabricating the memory device as claimed in claim 1, wherein a shape of the second tip corner of the floating gate is dupicated from the a shape of the first tip corner of the recessed feature.

3. The method for fabricating the memory device as claimed in claim 1, wherein the second dielectric layer is a single layer continuously covering a top surface and sidewalls of the floating gate.

4. The method for fabricating the memory device as claimed in claim 1, wherein forming the control gate partially over the floating gate further comprises:
   forming a control gate layer conformingly covering the floating gate; and
   patterning the control gate layer to form the control gate covering the second tip corner of the floating gate.

5. The method for fabricating the memory device as claimed in claim 4, wherein the control gate has a curve sidewall curving inwardly toward the floating gate.

6. The method for fabricating the memory device as claimed in claim 1, wherein the hard mask layer has a first portion having a flat top surface and a second portion having a curve top surface, and patterning the portion of the hard mask layer under the recess to form the recessed feature having a first tip corner further comprises:
    completely removing the first portion of the hard mask layer and partially removing the second portion of the hard mask layer.

7. A method of fabricating a memory device, comprising:
forming a floating gate layer over a substrate;
forming a hard mask layer having a recess over the floating gate layer;
patterning the hard mask layer to form a recessed feature having a first tip corner;
transferring a shape of the recessed feature to the floating gate layer thereby forming a floating gate having a second tip corner;
depositing a dielectric layer covering the second tip corner of the floating gate; and
forming a first control gate over the dielectric layer to partially cover the floating gate.

8. The method for fabricating the memory device as claimed in claim 7, wherein the dielectric layer continuously covers a top surface and two sidewalls of the floating gate.

9. The method for fabricating the memory device as claimed in claim 7, wherein a shape of the first tip corner is substantially equal to a shape of the second tip corner.

10. The method for fabricating the memory device as claimed in claim 7, wherein patterning the hard mask layer to form a recessed feature having a first tip corner further comprising:
    removing a first portion of the hard mask layer located outside the recess and a second portion of the hard mask layer located under a middle portion of the recess.

11. The method for fabricating the memory device as claimed in claim 10, wherein the first portion of the hard mask layer has a flat top surface and a second portion of the hard mask layer has a curve top surface.

12. A method of fabricating a memory device, comprising:
    forming a first dielectric layer over a semiconductor substrate:
    forming a floating gate layer over the first dielectric layer;
    forming a hard mask layer over the floating gate layer;
    etching the hard mask layer to form two recessed features separating from each other by an opening;
    patterning the floating gate layer to form a first floating gate and a second floating gate by transferring profiles of the recessed features to the floating gate layer;
    depositing a second dielectric layer over the first floating gate and the second floating gate; and
    forming a first control gate and a second control gate over the second dielectric layer, wherein the first control gate and the second control gate partially cover the first floating gate and the second floating gate respectively.

13. The method for fabricating the memory device as claimed in claim 12, wherein shapes of the first control gate and the second control gate are duplicated from the two recessed features such that the first control gate has a first tip corner and the second control gate has a second tip corner.

14. The method for fabricating the memory device as claimed in claim 12, wherein etching the hard mask layer to form two recessed features separating from each other by an opening comprises:
    etching the hard mask layer to form a recessed hard mask layer; and
    etching the recessed hard mask layer to form the opening separating the two recessed features.

15. The method for fabricating the memory device as claimed in claim 14, further comprising:
    removing an outer portion of the recessed hard mask layer.

16. The method for fabricating the memory device as claimed in claim 13, wherein the second dielectric layer continuously covers the first floating gate.

17. The method for fabricating the memory device as claimed in claim 13, wherein the first floating gate has a curve upper surface, a first sidewall and a second sidewall lower than the first sidewall, and the first sidewall and the curve upper surface join at the first tip corner covered by the first control gate.

18. The method for fabricating the memory device as claimed in claim 12, wherein patterning the floating gate layer to form the first floating gate and the second floating gate by transferring profiles of the recessed features to the floating gate layer further comprises:
    isotropically etching portions of the recessed features and the floating gate layer; and
    anisotropically etching remaining portions of the upper recessed features and the floating gate layer to form the first floating gate and the second floating gate.

19. The method for fabricating the memory device as claimed in claim 18, wherein a ratio of an etching rate of isotropically etching the portion of the recessed features to an etching rate of isotropically etching the portion of the floating gate layer is in a range from about 0.5 to about 1.5.

20. The method for fabricating the memory device as claimed in claim 18, wherein a ratio of an etching rate of anisotropically etching the remaining portion of the upper recessed features to an etching rate of anisotropically etching the remaining portion of the floating gate layer is in a range from about 5 to about 10.

* * * * *